United States Patent
Feldman-Peabody et al.

(10) Patent No.: US 9,147,794 B2
(45) Date of Patent: Sep. 29, 2015

(54) THREE TERMINAL THIN FILM PHOTOVOLTAIC MODULE AND THEIR METHODS OF MANUFACTURE

(75) Inventors: Scott Daniel Feldman-Peabody, Golden, CO (US); Luke W. Jacobson, Arvada, CO (US); Robert A. Garber, Denver, CO (US); Fred Harper Seymour, Evergreen, CO (US); Troy Alan Berens, Evergreen, CO (US)

(73) Assignee: First Solar, Inc., Tempe, AZ (US)

( * ) Notice: Subject to any disclaimer, the term of this patent is extended or adjusted under 35 U.S.C. 154(b) by 893 days.

(21) Appl. No.: 13/308,314

(22) Filed: Nov. 30, 2011

(65) Prior Publication Data
US 2013/0133712 A1    May 30, 2013

(51) Int. Cl.
| | | |
|---|---|---|
| H01L 31/05 | (2014.01) | |
| H01L 31/18 | (2006.01) | |
| H01L 31/073 | (2012.01) | |
| H01L 31/0463 | (2014.01) | |
| H01L 31/0465 | (2014.01) | |

(52) U.S. Cl.
CPC ........ *H01L 31/1864* (2013.01); *H01L 31/0463* (2014.12); *H01L 31/0465* (2014.12); *H01L 31/073* (2013.01); *Y02E 10/543* (2013.01)

(58) Field of Classification Search
CPC .............. H01L 31/1864; H01L 31/073; H01L 31/0465; H01L 31/0463
USPC ............................................ 136/244; 438/80
See application file for complete search history.

(56) References Cited

U.S. PATENT DOCUMENTS

| | | | |
|---|---|---|---|
| 4,624,045 A * | 11/1986 | Ishihara et al. ................. 438/80 |
| 4,668,840 A * | 5/1987 | Kiyama et al. ................ 136/244 |
| 4,784,701 A * | 11/1988 | Sakai et al. .................... 136/249 |
| 5,348,589 A * | 9/1994 | Arai et al. ...................... 136/244 |
| 5,421,908 A * | 6/1995 | Yoshida et al. ............... 136/244 |
| 5,593,901 A | 1/1997 | Oswald et al. |
| 5,626,686 A * | 5/1997 | Yoshida ......................... 136/244 |
| 6,469,242 B1 * | 10/2002 | Kondo ........................... 136/251 |
| 7,951,641 B2 | 5/2011 | Campbell et al. |
| 8,748,728 B2 * | 6/2014 | Bi et al. ......................... 136/244 |
| 8,907,203 B2 * | 12/2014 | Nasuno et al. ................ 136/244 |
| 2009/0260671 A1 | 10/2009 | Green et al. |
| 2010/0236607 A1 * | 9/2010 | Korevaar et al. ............. 136/249 |
| 2011/0088742 A1 | 4/2011 | Casler et al. |

(Continued)

OTHER PUBLICATIONS

Troy Alan Berens, U.S. Appl. No. 13/308,355, filed Nov. 30, 2011, Three Terminal Thin Film Photovoltaic Module and Their Methods of Manufacture.

(Continued)

*Primary Examiner* — Golam Mowla
(74) *Attorney, Agent, or Firm* — MacMillan, Sobanski & Todd, LLC

(57) ABSTRACT

Thin film photovoltaic devices are generally provided having three terminals. In one embodiment, the thin film photovoltaic device can include a first submodule defined by a first plurality of photovoltaic cells between a first dead cell and a first terminal cell; a second submodule defined by a second plurality of photovoltaic cells between a second dead cell and a second terminal cell; and a joint bus bar electrically connected to the first dead cell and the second dead cell. The first dead cell is adjacent to the second dead cell, with the first dead cell being separated from the second dead cell via a separation scribe. Methods are also generally provided for forming a thin film photovoltaic device.

20 Claims, 9 Drawing Sheets

(56) References Cited

U.S. PATENT DOCUMENTS

2011/0140528 A1   6/2011   Pasi et al.
2013/0008481 A1*  1/2013   Chow et al. .................. 136/244

OTHER PUBLICATIONS

Troy Alan Berens, U.S. Appl. No. 13/308,336, filed Nov. 30, 2011, Three Terminal Thin Film Photovoltaic Module and Their Methods of Manufacture.

* cited by examiner

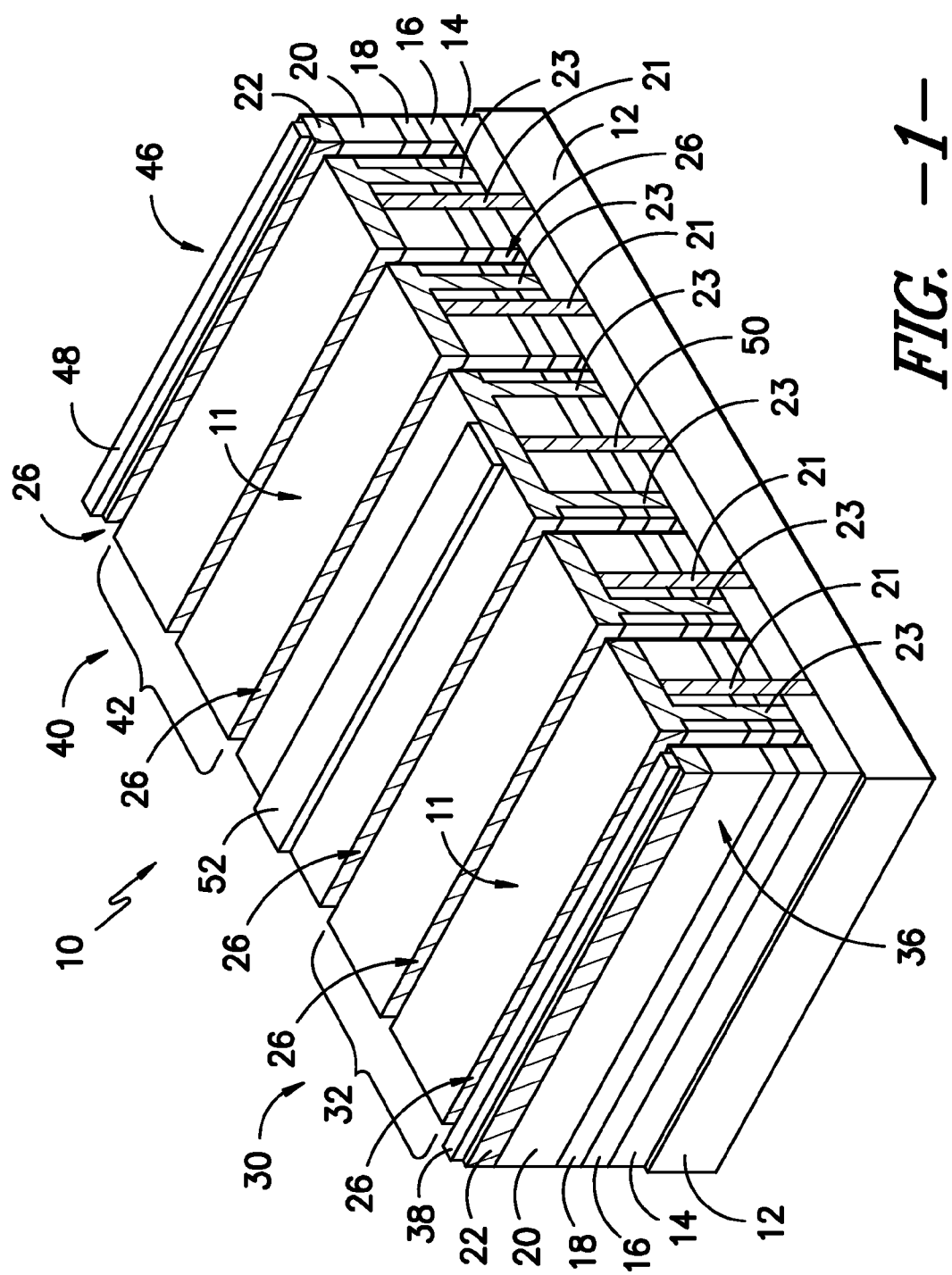
FIG. -1-

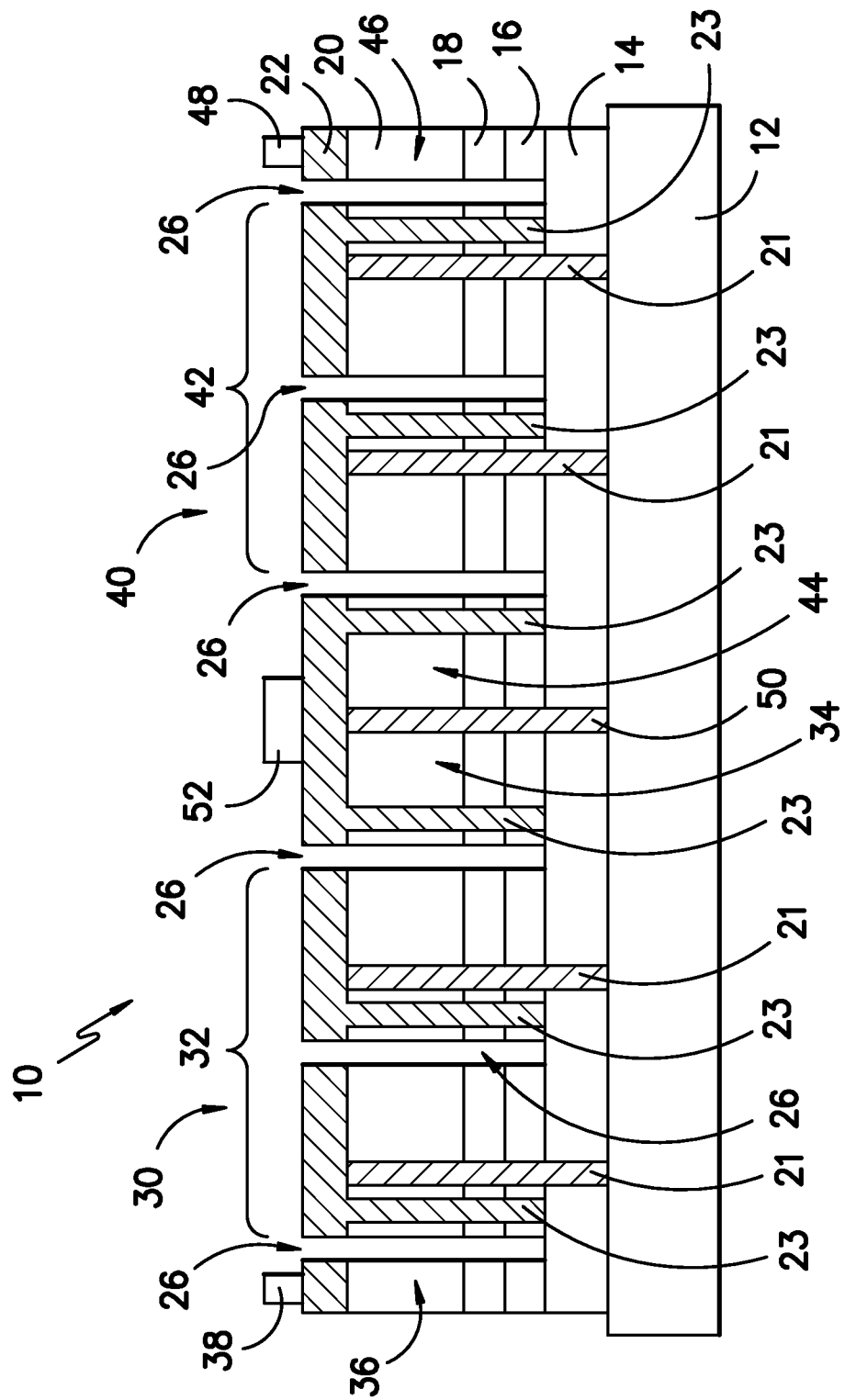
FIG. -2-

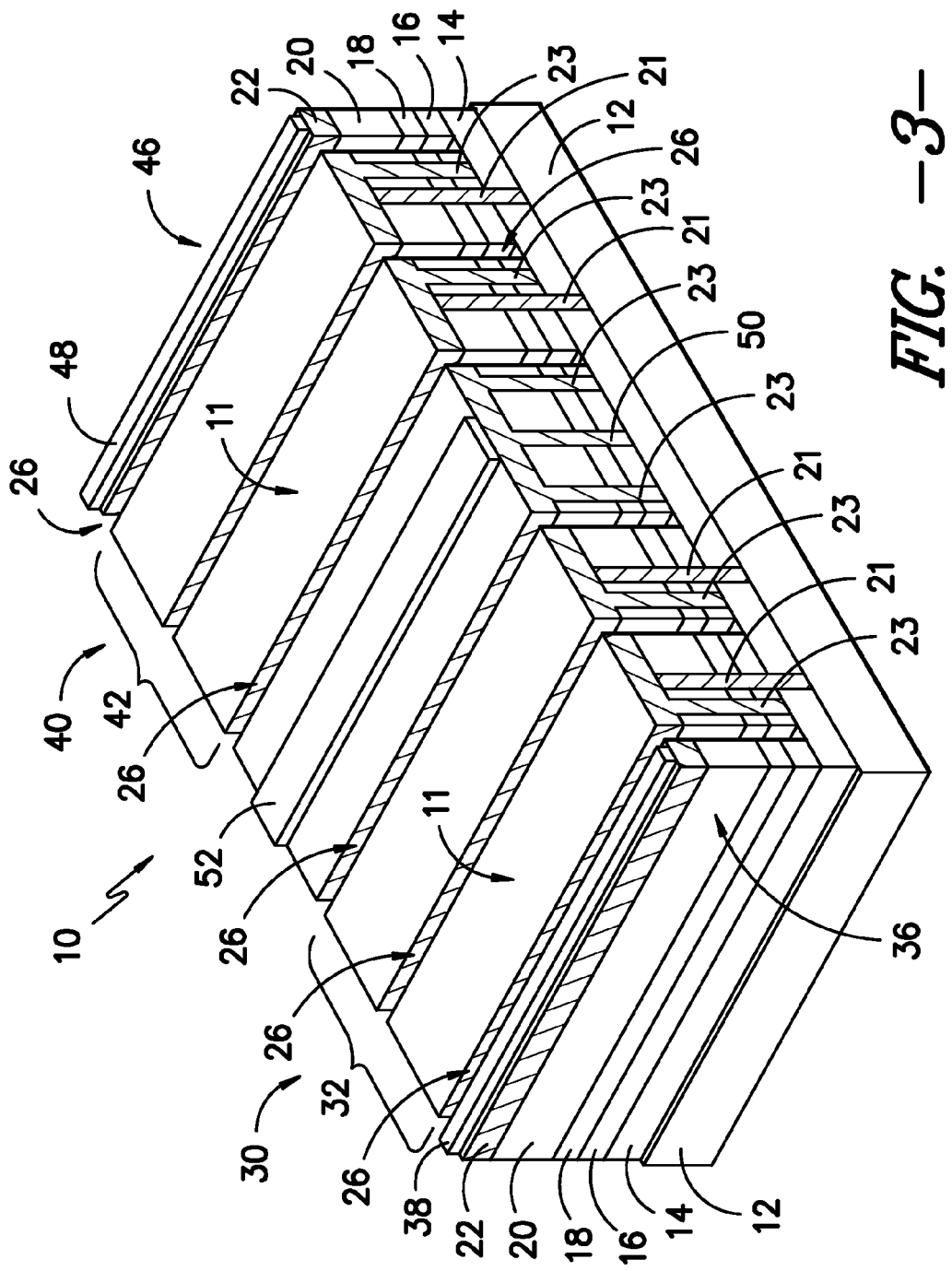
FIG. -3-

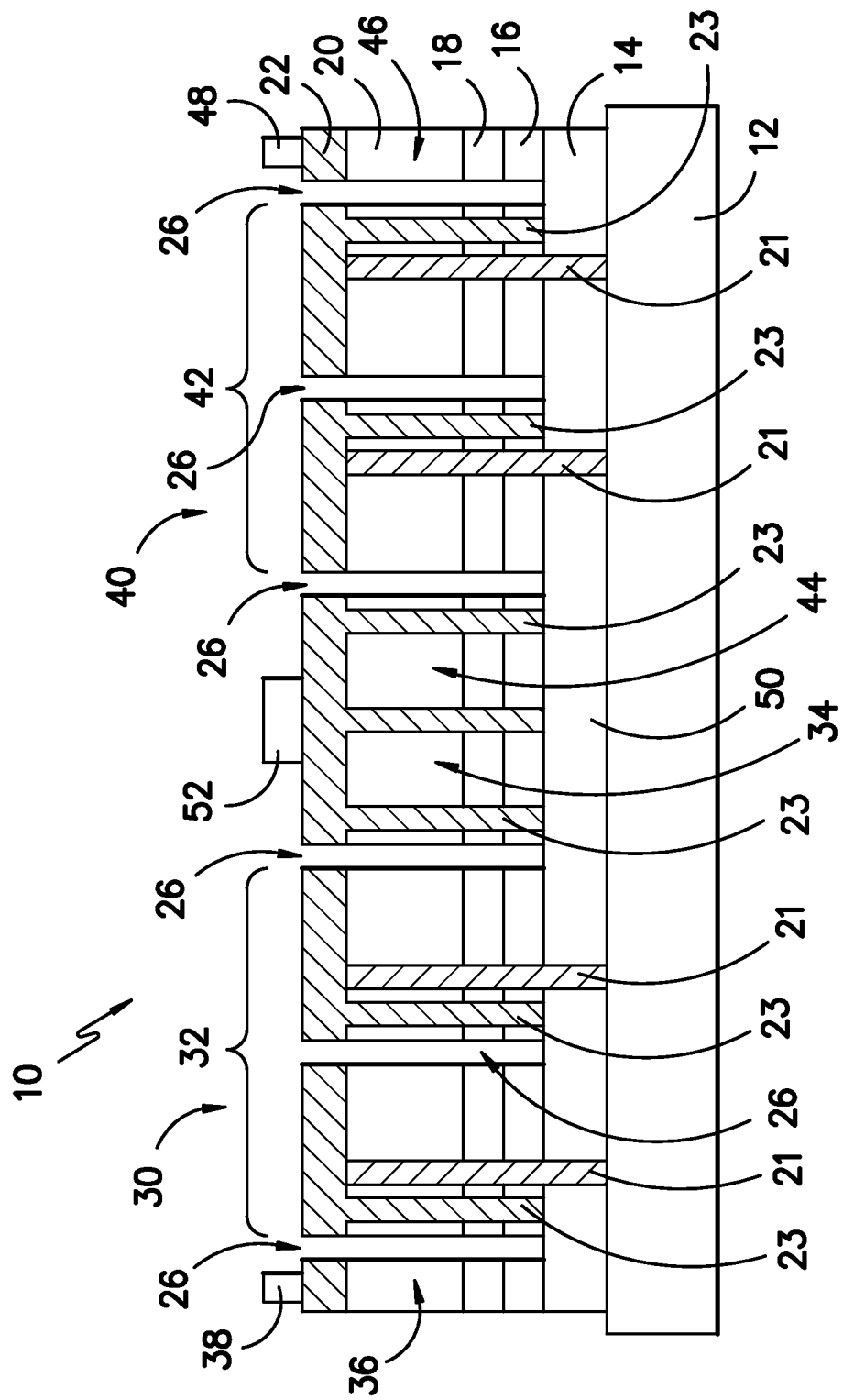
FIG. -4-

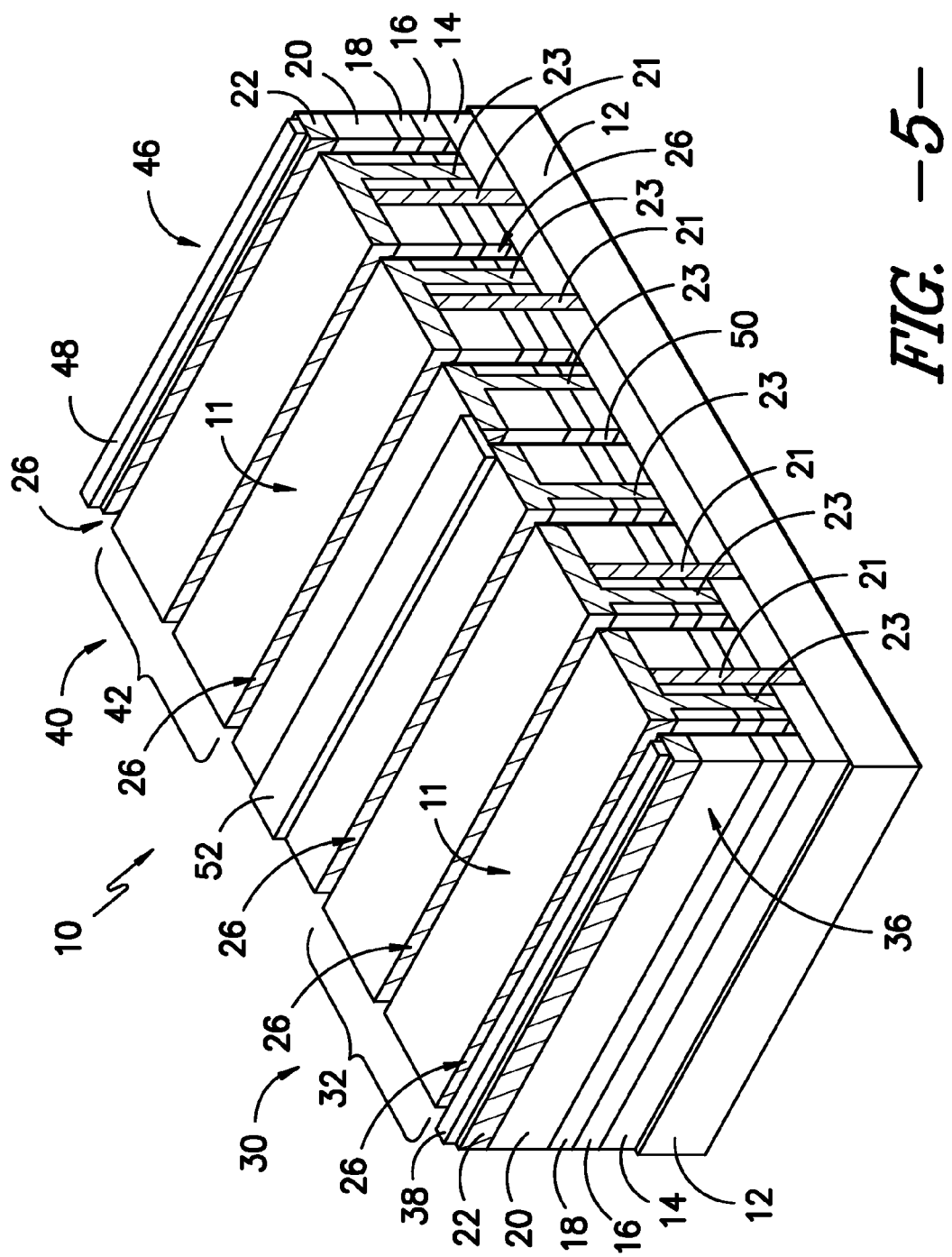
FIG. -5-

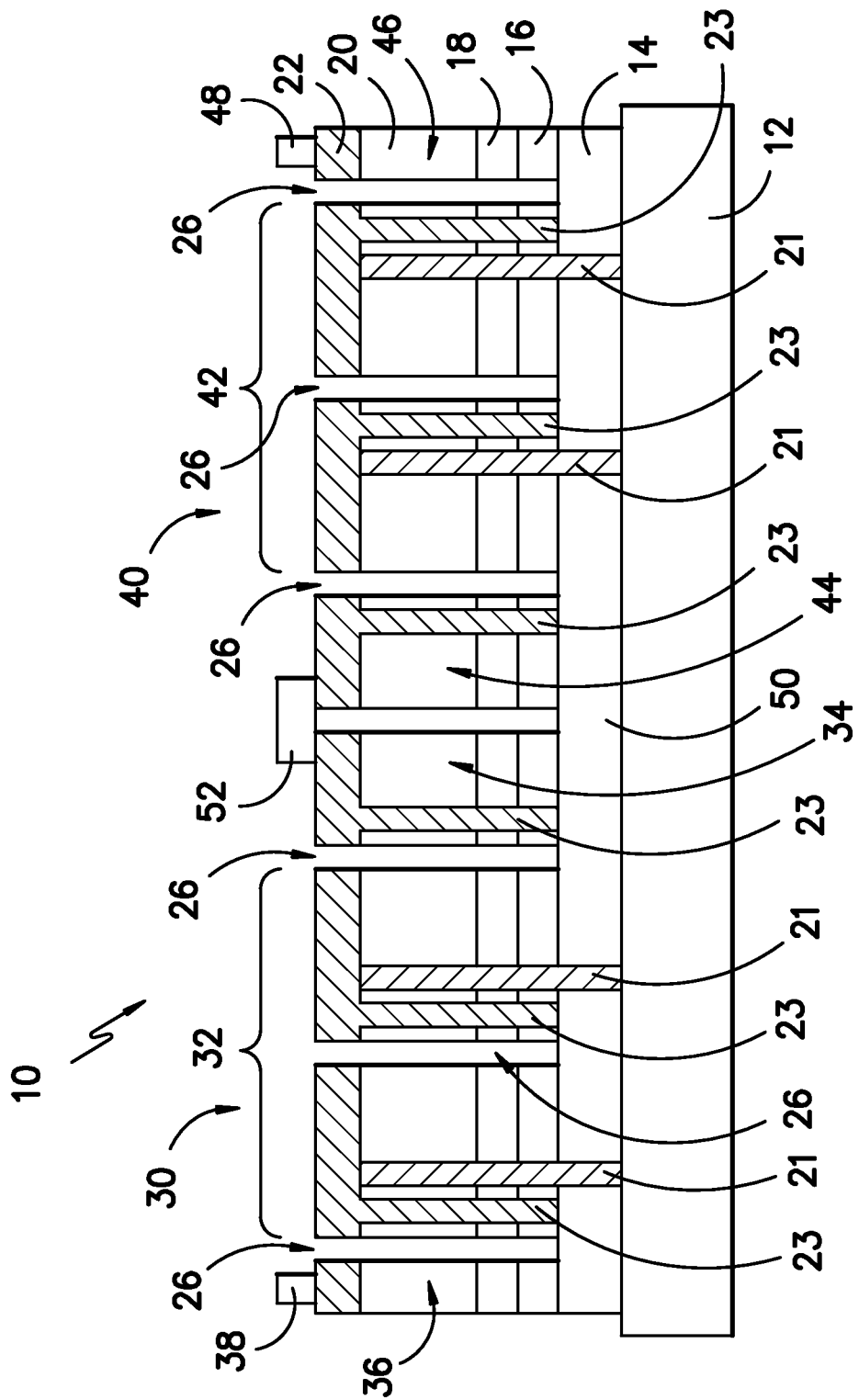
FIG. -6-

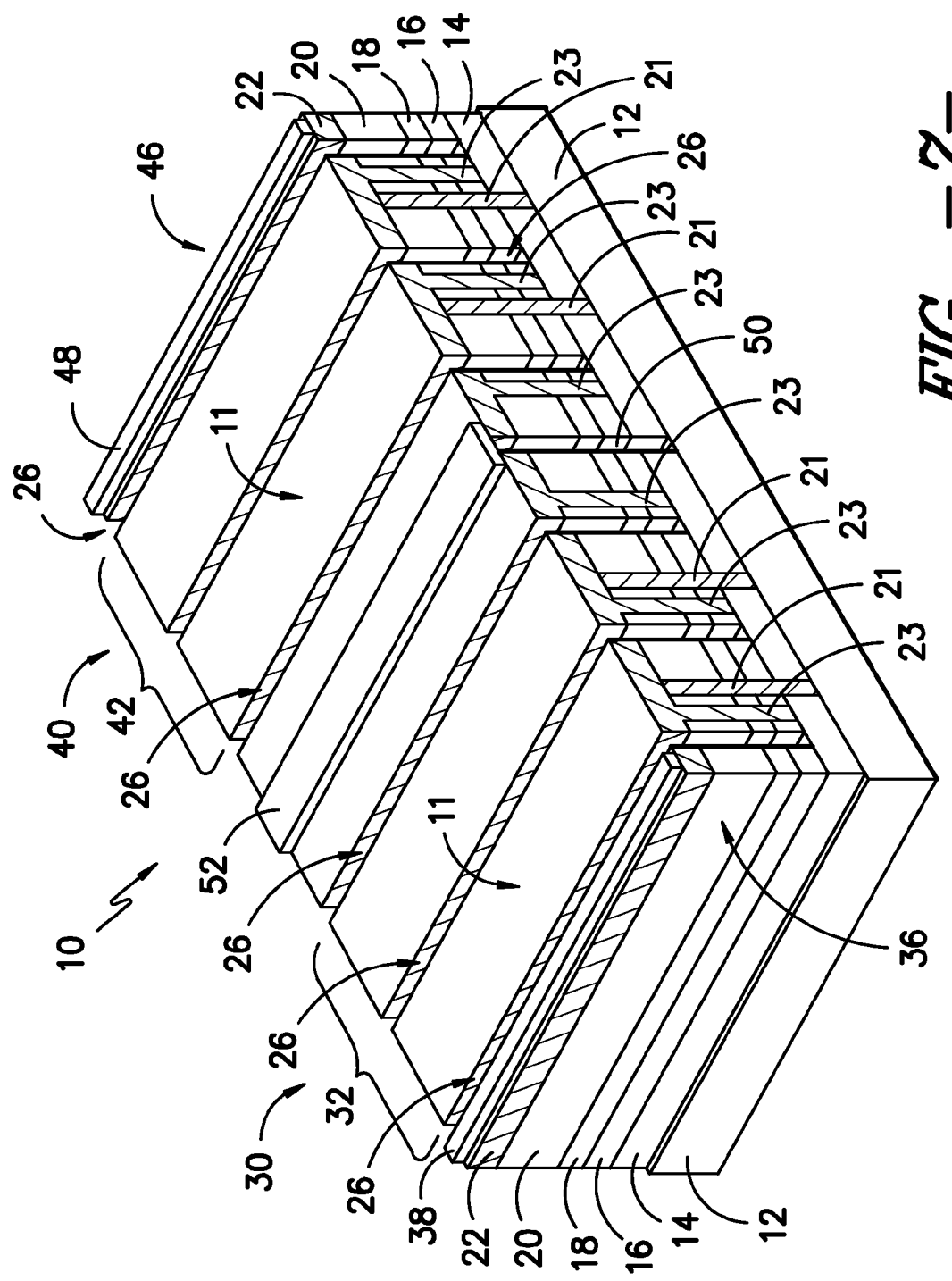
FIG. -7-

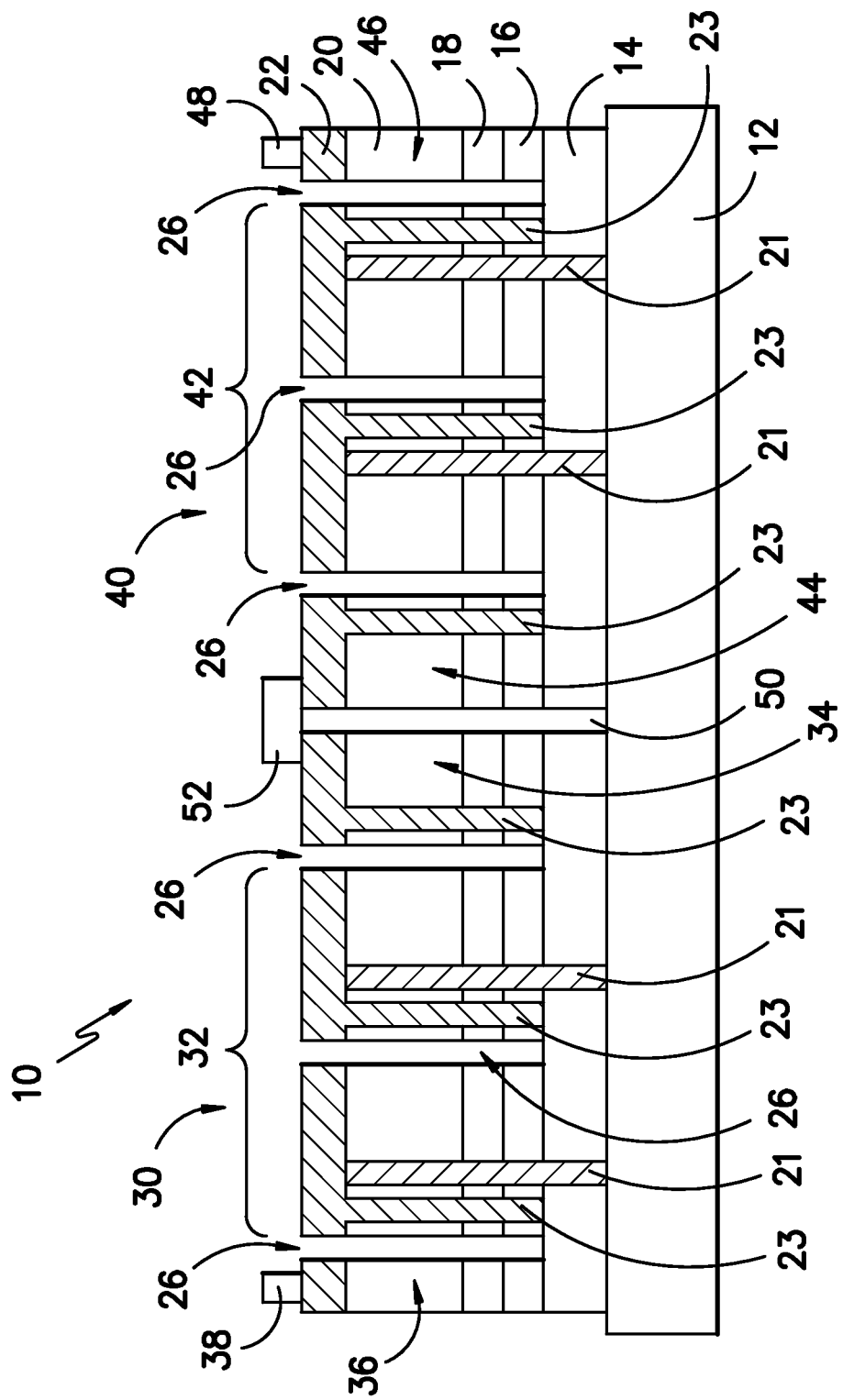
FIG. -8-

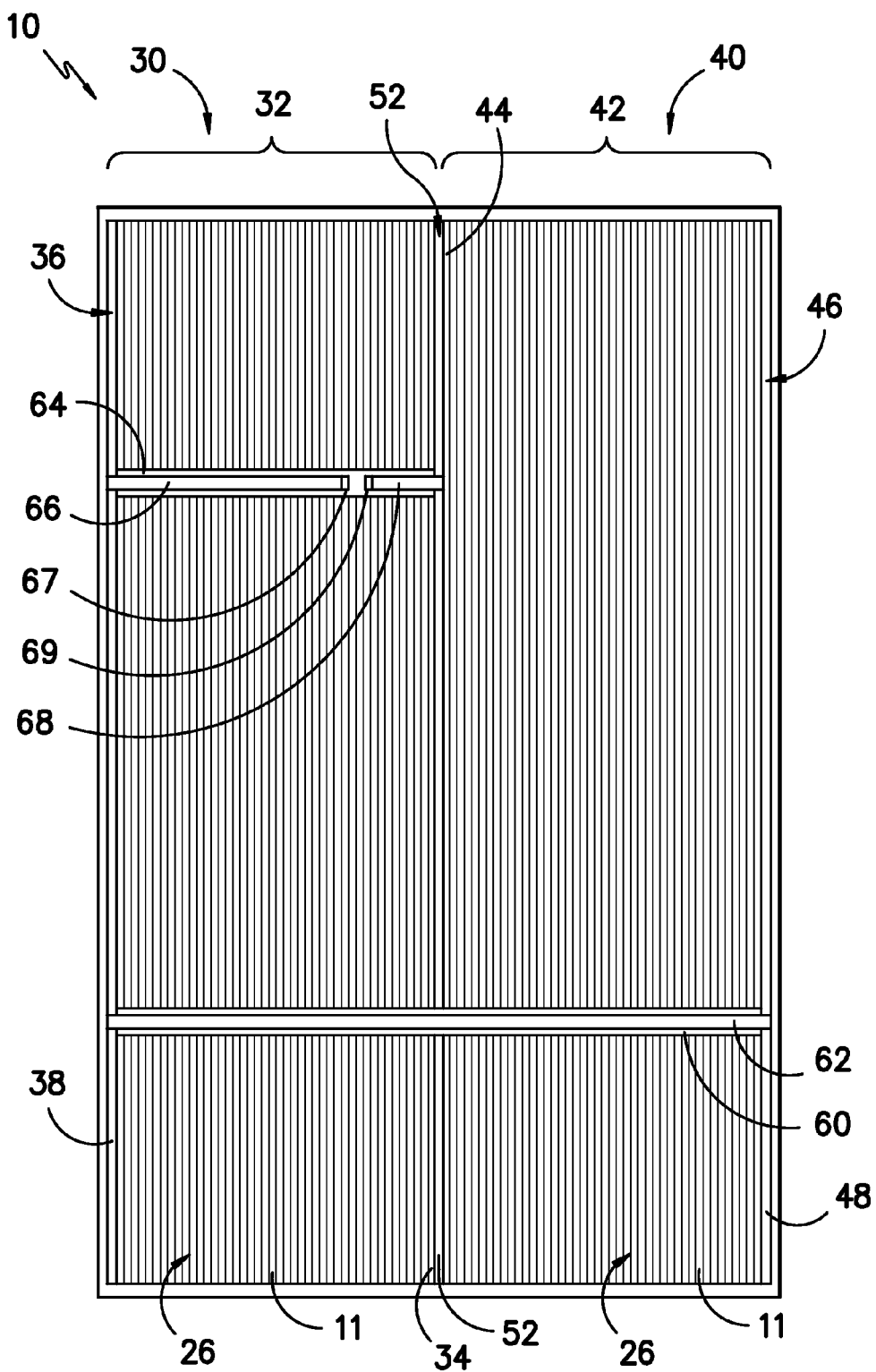
FIG. -9-

THREE TERMINAL THIN FILM PHOTOVOLTAIC MODULE AND THEIR METHODS OF MANUFACTURE

FIELD OF THE INVENTION

The subject matter disclosed herein relates generally to terminal configurations of a thin film photovoltaic module having a plurality of thin film photovoltaic cells. More particularly, the subject matter disclosed herein relates to a three terminal configuration of a thin film photovoltaic device.

BACKGROUND OF THE INVENTION

Thin film photovoltaic (PV) modules (also referred to as "solar panels") based on cadmium telluride (CdTe) paired with cadmium sulfide (CdS) as the photo-reactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials. The junction of the n-type layer and the p-type layer is generally responsible for the generation of electric potential and electric current when the CdTe PV module is exposed to light energy, such as sunlight. Specifically, the cadmium telluride (CdTe) layer and the cadmium sulfide (CdS) form a p-n heterojunction, where the CdTe layer acts as a p-type layer (i.e., an electron accepting layer) and the CdS layer acts as a n-type layer (i.e., an electron donating layer).

The photovoltaic modules are typically deployed in the field by connected a plurality of modules in series to form a "string" of PV modules. The fewer strings that can be used, the lower the total balance of the system costs. However, the number of solar modules in each string is limited in total voltage per string. With respect to CdTe PV modules, which have relatively high voltage per cell due to the relatively high band gap of CdTe, fewer modules can be linked together in each string than may be desired.

Thus, a need exists for photovoltaic modules having lower voltages, particularly with respect to CdTe photovoltaic devices.

BRIEF DESCRIPTION OF THE INVENTION

Aspects and advantages of the invention will be set forth in part in the following description, or may be obvious from the description, or may be learned through practice of the invention.

Thin film photovoltaic devices are generally provided having three terminals. In one embodiment, the thin film photovoltaic device can include a first submodule defined by a first plurality of photovoltaic cells between a first dead cell and a first terminal cell; a second submodule defined by a second plurality of photovoltaic cells between a second dead cell and a second terminal cell; and a joint bus bar electrically connected to the first dead cell and the second dead cell. The first dead cell is adjacent to the second dead cell, with the first dead cell being separated from the second dead cell via a separation scribe.

Methods are also generally provided for forming a thin film photovoltaic device. The method can include, for example, attaching a first terminal to a first terminal cell to electrically connect the first terminal to the first terminal cell, where the first terminal cell is positioned on one end of a first submodule defined by a first plurality of photovoltaic cells between the first terminal cell and a first dead cell. A joint bus bar can be attached to the first dead cell and to a second dead cell to electrically connect the first dead cell and the second dead cell, where the second dead cell is positioned on one end of a second submodule defined by a second plurality of photovoltaic cells between the second dead cell and a second terminal. The first dead cell and the second dead cell are separated via a separation scribe. A second terminal can be attached to the second terminal cell to electrically connect the second terminal to the second terminal cell.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which:

FIG. 1 shows a general schematic of a perspective view of exemplary thin film photovoltaic device having three terminals;

FIG. 2 shows a cross-sectional view of the exemplary thin film photovoltaic device of FIG. 1;

FIG. 3 shows a general schematic of a perspective view of another exemplary thin film photovoltaic device having three terminals;

FIG. 4 shows a cross-sectional view of the exemplary thin film photovoltaic device of FIG. 3;

FIG. 5 shows a general schematic of a perspective view of yet another exemplary thin film photovoltaic device having three terminals;

FIG. 6 shows a cross-sectional view of the exemplary thin film photovoltaic device of FIG. 5;

FIG. 7 shows a general schematic of a perspective view of yet another exemplary thin film photovoltaic device having three terminals;

FIG. 8 shows a cross-sectional view of the exemplary thin film photovoltaic device of FIG. 7; and, FIG. 9 shows an exemplary configuration schematic of an exemplary thin film photovoltaic device having three terminals as in any of FIGS. 1-8.

Repeat use of reference characters in the present specification and drawings is intended to represent the same or analogous features or elements.

DETAILED DESCRIPTION OF THE INVENTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers, unless otherwise stated. Thus, these terms are simply describing the relative position of the layers to each other and do not necessarily mean "on top of" since the relative position above or below depends upon the orientation of the device to the viewer. Additionally, although the invention is not limited to any particular film thickness, the term "thin" describing any film layers of the photovoltaic device generally refers to the film layer having a thickness less than about 10 micrometers ("microns" or "µm").

It is to be understood that the ranges and limits mentioned herein include all ranges located within the prescribed limits (i.e., subranges). For instance, a range from about 100 to about 200 also includes ranges from 110 to 150, 170 to 190, 153 to 162, and 145.3 to 149.6. Further, a limit of up to about 7 also includes a limit of up to about 5, up to 3, and up to about 4.5, as well as ranges within the limit, such as from about 1 to about 5, and from about 3.2 to about 6.5.

Thin film photovoltaic devices are generally provided having three terminals, along with methods of making the same. Generally, the device includes a joint bus bar electrically connected to adjacent dead cells (i.e., a first dead cell and a second dead cell) such that a first submodule and a second submodule can simultaneously utilize the joint bus bar. As such, in one particular embodiment, the device can utilize the joint bus bar to minimize the surface area dedicated to the dead cells in the device. Additionally, splitting the PV device into two submodules can decrease the module voltage when compared to a same size module using a single module over the entire PV device. The two submodules can be, in one particular embodiment, connected in parallel.

FIGS. 1-8 show exemplary thin film photovoltaic devices 10 having a first terminal 38, a second terminal 48, and a joint bus bar 52. In each exemplary embodiment, the device 10 generally includes a first submodule 30 and a second submodule 40. The first submodule 30 is defined by a first plurality 32 of photovoltaic cells 11 between a first dead cell 34 and a first terminal cell 36. Likewise, the second submodule 40 is defined by a second plurality 42 of photovoltaic cells 11 between a second dead cell 44 and a second terminal cell 46. The first submodule 30 and the second submodule 40 are separated by a separation scribe 50. For instance, in the embodiments shown in FIGS. 1-8, the separation scribe 50 is positioned between the first dead cell 34 and the second dead cell 44.

The joint bus bar 52 is electrically connected to the first dead cell 34 and the second dead cell 44. For example, in the embodiments shown, the joint bus bar 52 spans across the separation scribe 50 and onto each of the first dead cell 34 and the second dead cell 44. Specifically, the joint bus bar 52 touches the back contact layer 22 on both of the first dead cell 34 and the second dead cell 44 to connect the first submodule 30 and second submodule 40 in parallel.

A first terminal 38 is electrically connected to the first terminal cell 36 of the first submodule 30, and a second terminal 48 is electrically connected to the second terminal cell 46 of the second submodule 40. As such, the first terminal 38 and the second terminal 48 serve as the opposite terminals to the joint bus bar 52 in the device 10.

As stated, FIGS. 1-8 show cross-sections of exemplary thin film photovoltaic devices 10 where the first submodule 30 and the second submodule 40 are defined on either side of the separation scribe 50 positioned between the first dead cell 34 and the second dead cell 44. The device 10 is shown including a transparent substrate 12, a transparent conductive oxide ("TCO") layer 14, an optional resistive transparent buffer ("RTB") layer 16, a n-type window layer 18 (e.g., a cadmium sulfide layer), a absorber layer 20 (e.g., a cadmium telluride layer), and a back contact layer 22 (e.g., a graphite layer, a metal contact layer, etc., or a combination thereof). However, it is to be understood that any suitable thin film stack can be utilized to form the thin film photovoltaic device 10.

In the embodiment shown in FIGS. 1-2, the separation scribe 50 extends through the absorber layer 20, the n-type window layer 18, the optional resistive transparent buffer layer 16, and the transparent conductive oxide layer 14. In this embodiment, the separation scribe 50 is filled with a nonconductive material (e.g., a dielectric material and/or photoresist material) in the device 10. As shown, the back contact 22 can be formed over the dead cells 34, 44 and the separation scribe 50 filled with the nonconductive material. Thus, in this embodiment, the separation scribe 50 can be similar to the first isolation scribes 21, which are discussed in greater detail below.

In the embodiment shown in FIGS. 3-4, the separation scribe 50 extends through the absorber layer 20, the n-type window layer 18, and the optional resistive transparent buffer layer 16. In this embodiment, the separation scribe 50 does not extend through the transparent conductive oxide layer 14. For example, the separation scribe 50 can be filled with the back contact material 22 similarly to the series connecting scribes 23, which are discussed in greater detail below.

Like the embodiment of FIGS. 3-4, the embodiment of FIGS. 5-6 show the separation scribe 50 extending through the absorber layer 20, the n-type window layer 18, and the optional resistive transparent buffer layer 16, but not extending through the transparent conductive oxide layer 14. In this embodiment, the separation scribe 50 is left unfilled in the device 10.

In the embodiment shown in FIGS. 7-8, the separation scribe 50 extends through the back contact 22, the absorber layer 20, the n-type window layer 18, and the optional resistive transparent buffer layer 16, and the transparent conductive oxide layer 14. In this embodiment, the separation scribe 50 is left unfilled in the device 10.

As shown in FIGS. 1-8, the photovoltaic device 10 generally includes a first submodule 30 and a second submodule 40. Although shown with two photovoltaic cells 11, the first submodule 30 can include any desired number of photovoltaic cells 11 to form a first plurality 32 of photovoltaic cells 11. Likewise, the second submodule 40 can include any desired number of photovoltaic cells 11 to form a second plurality 42 of photovoltaic cells 11. In both submodules 30, 40, the photovoltaic cells are separated from each other by scribe lines 21, 23, 26, generally formed via a laser scribing process, though in general another scribing process could be used, such as a mechanical scribe, a chemical etch, etc., or combinations thereof.

For example, the laser scribing process can entail defining a first isolation scribe 21 (also know as a "P1 scribe") from the substrate 12 through the photo reactive layers (i.e., the n-type window layer 18 and the absorber layer 20), including the underlying layers (i.e., through the TCO layer 14). For example, the first isolation scribe 21 can be formed via laser scribing through the transparent substrate 12 to remove the TCO layer 14, the RTB layer 16, the n-type window layer 18, and the absorber layer 20 prior to application of the back contact layer 22. The first isolation scribe line 21 can then filled with a nonconductive material before application of the back contact layer 22 in order to ensure that the TCO layer 14 is electrically isolated between adjacent photovoltaic cells 11. For example, the first isolation scribe 21 can be filled using a photoresist development process wherein a liquid negative photoresist (NPR) material is coated onto the absorber layer 20 by spraying, roll coating, screen printing, or any other suitable application process. The substrate 12 is then exposed to light from below such that the NPR material in the first isolation scribes 21 (and any pinholes in the absorber layer 20) are exposed to the light, causing the exposed NPR polymers to crosslink and "harden." The substrate 12 can then be "developed" in a process wherein a chemical developer is applied to the absorber layer 20 to dissolve any unhardened NPR material. In other words, the NPR material that was not exposed to the light is washed away from the absorber layer 20 by the developer, leaving the first isolation scribes 21 filled with the NPR material.

In one embodiment, after filling the first isolation scribes 21, a graphite layer can be applied onto the absorber layer 20 for form part of the back contact layer 22.

A series connecting scribe 23 (also known as a "P2 scribe") can then be laser formed from the graphite layer (if present) through absorber layer 20 to the TCO layer 14 and filled with the conductive metallic material of the back contact layer 22 to electrically connect adjacent cells to each other in series. Of course, any conductive material can be included in the series connecting scribes 23. Specifically, the series connecting scribe 23 can allow the back contact layer 22 to contact the TCO layer 14 providing a direct electrical connection between the back contact 22 (e.g., a combination of the optional graphite layer and a metal layer) and the front contact material (i.e., the TCO layer 14).

Finally, a second isolation scribe 26 can be laser cut through the back contact (e.g., the optional graphite layer and the metal layer) and photo reactive layers (i.e., the n-type window layer 18 and the absorber layer 20) to isolate the back contact into individual cells.

As stated, the exemplary devices 10 of FIGS. 1-8 includes a transparent substrate 12 (e.g., which can be employed as a superstrate) on which the subsequent thin film layers 14, 16, 18, 20, and 22 are formed and that faces upwards to the radiation source (e.g., the sun) when the thin film photovoltaic device 10 is in used. The transparent substrate 12 can, in particular embodiments, be a high-transmission glass (e.g., high transmission borosilicate glass), low-iron float glass, or another highly transparent material. The glass is generally thick enough to provide support for the subsequent film layers (e.g., from about 0.5 mm to about 10 mm thick), and is substantially flat to provide a good surface for forming the subsequent film layers. In one embodiment, the superstrate 12 can be a borosilicate glass having a thickness of about 0.5 mm to about 2.5 mm.

The transparent conductive oxide (TCO) layer 14 is shown on the superstrate 12 of the exemplary device 10. The TCO layer 14 allows light to pass through with minimal absorption while also allowing electric current produced by the device 10 to travel sideways to opaque metal conductors (not shown). For instance, the TCO layer 14 can have a sheet resistance less than about 30 ohm per square, such as from about 4 ohm per square to about 20 ohm per square (e.g., from about 8 ohm per square to about 15 ohm per square). The TCO layer 14 generally includes at least one conductive oxide, such as tin oxide, zinc oxide, or indium tin oxide, or mixtures thereof. Additionally, the TCO layer 14 can include other conductive, transparent materials. The TCO layer 14 can also include zinc stannate and/or cadmium stannate.

The TCO layer 14 can be formed by sputtering, chemical vapor deposition, spray pyrolysis, or any other suitable deposition method. In one particular embodiment, the TCO layer 14 can be formed by sputtering, either DC sputtering or RF sputtering, on the substrate 12. For example, a cadmium stannate layer can be formed by sputtering a hot-pressed target containing stoichiometric amounts of $SnO_2$ and CdO onto the substrate 12 in a ratio of about 1 to about 2. The cadmium stannate can alternatively be prepared by using cadmium acetate and tin (II) chloride precursors by spray pyrolysis.

In certain embodiments, the TCO layer 14 can have a thickness between about 0.1 µm and about 1 µm, for example from about 0.1 µm to about 0.5 µm, such as from about 0.25 µm to about 0.35 µm.

The optional resistive transparent buffer layer 16 (RTB layer) is shown on the TCO layer 14 on the exemplary thin film photovoltaic device 10. The RTB layer 16 is generally more resistive than the TCO layer 14 and can help protect the device 10 from chemical interactions between the TCO layer 14 and the subsequent layers during processing of the device 10. For example, in certain embodiments, the RTB layer 16 can have a sheet resistance that is greater than about 1000 ohms per square, such as from about 10 kOhms per square to about 1000 MOhms per square. The RTB layer 16 can also have a wide optical bandgap (e.g., greater than about 2.5 eV, such as from about 2.7 eV to about 3.0 eV).

Without wishing to be bound by a particular theory, it is believed that the presence of the RTB layer 16 between the TCO layer 14 and the n-type window layer 18 can allow for a relatively thin n-type window layer 18 to be included in the device 10 by reducing the possibility of interface defects (i.e., "pinholes" in the n-type window layer 18) creating shunts between the TCO layer 14 and the absorber layer 22. Thus, it is believed that the RTB layer 16 allows for improved adhesion and/or interaction between the TCO layer 14 and the absorber layer 22, thereby allowing a relatively thin n-type window layer 18 to be formed thereon without significant adverse effects that would otherwise result from such a relatively thin n-type window layer 18 formed directly on the TCO layer 14.

The RTB layer 16 can include, for instance, a combination of zinc oxide (ZnO) and tin oxide ($SnO_2$), which can be referred to as a zinc tin oxide layer ("ZTO"). In one particular embodiment, the RTB layer 16 can include more tin oxide than zinc oxide. For example, the RTB layer 16 can have a composition with a stoichiometric ratio of $ZnO/SnO_2$ between about 0.25 and about 3, such as in about an one to two (1:2) stoichiometric ratio of tin oxide to zinc oxide. The RTB layer 16 can be formed by sputtering, chemical vapor deposition, spraying pyrolysis, or any other suitable deposition method. In one particular embodiment, the RTB layer 16 can be formed by sputtering, either DC sputtering or RF sputtering, on the TCO layer 14. For example, the RTB layer 16 can be deposited using a DC sputtering method by applying a DC current to a metallic source material (e.g., elemental zinc, elemental tin, or a mixture thereof) and sputtering the metallic source material onto the TCO layer 14 in the presence of an oxidizing atmosphere (e.g., $O_2$ gas). When the oxidizing atmosphere includes oxygen gas (i.e., $O_2$), the atmosphere can be greater than about 95% pure oxygen, such as greater than about 99%.

In certain embodiments, the RTB layer 16 can have a thickness between about 0.075 µm and about 1 µm, for example from about 0.1 µm to about 0.5 µm. In particular embodiments, the RTB layer 16 can have a thickness between about 0.08 μm and about 0.2 μm, for example from about 0.1 μm to about 0.15 μm.

The n-type window layer 18 is shown on resistive transparent buffer layer 16 of the exemplary device 10. In one particular embodiment, the n-type window layer 18 can generally includes cadmium sulfide (CdS) but may also include other materials, such as zinc sulfide, cadmium zinc sulfide, etc., and mixtures thereof as well as dopants and other impurities. As such, the n-type window layer 18 may be referred to as a cadmium sulfide layer, when primarily composed of cadmium sulfide. In one particular embodiment, the cadmium sulfide layer may include oxygen up to about 25% by atomic percentage, for example from about 5% to about 20% by atomic percentage. The n-type window layer 18 can have a wide band gap (e.g., from about 2.25 eV to about 2.5 eV, such as about 2.4 eV) in order to allow most radiation energy (e.g., solar radiation) to pass. As such, the n-type window layer 18 is considered a transparent layer on the device 10.

The n-type window layer 18 can be formed by sputtering, chemical vapor deposition, chemical bath deposition, and other suitable deposition methods. In one particular embodiment, the cadmium sulfide layer 18 can be formed by sputtering, either direct current (DC) sputtering or radio frequency (RF) sputtering, on the resistive transparent buffer layer 16. Sputtering deposition generally involves ejecting material from a target, which is the material source, and depositing the ejected material onto the substrate to form the film. DC sputtering generally involves applying a voltage to a metal target (i.e., the cathode) positioned near the substrate (i.e., the anode) within a sputtering chamber to form a direct-current discharge. The sputtering chamber can have a reactive atmosphere (e.g., an oxygen atmosphere, nitrogen atmosphere, fluorine atmosphere) that forms a plasma field between the metal target and the substrate. The pressure of the reactive atmosphere can be between about 1 mTorr and about 20 mTorr for magnetron sputtering. When metal atoms are released from the target upon application of the voltage, the metal atoms can react with the plasma and deposit onto the surface of the substrate. For example, when the atmosphere contains oxygen, the metal atoms released from the metal target can form a metallic oxide layer on the substrate. Conversely, RF sputtering generally involves exciting a capacitive discharge by applying an alternating-current (AC) or radio-frequency (RF) signal between the target (e.g., a ceramic source material) and the substrate. The sputtering chamber can have an inert atmosphere (e.g., an argon atmosphere) having a pressure between about 1 mTorr and about 20 mTorr.

Due to the presence of the resistive transparent buffer layer 16, the n-type window layer 18 can have a thickness that is less than about 0.1 μm, such as between about 10 nm and about 100 nm, such as from about 50 nm to about 80 nm, with a minimal presence of pinholes between the resistive transparent buffer layer 16 and the n-type window layer 18. Additionally, a n-type window layer 18 having a thickness less than about 0.1 μm reduces any adsorption of radiation energy by the n-type window layer 18, effectively increasing the amount of radiation energy reaching the underlying absorber layer 20.

The absorber layer 20 is a p-type layer that interacts with the n-type window layer 18 (e.g., a cadmium sulfide layer) to produce current from the adsorption of radiation energy by absorbing the majority of the radiation energy passing into the device 10 due to its high absorption coefficient and creating electron-hole pairs. In one particular embodiment, the absorber layer 20 generally includes cadmium telluride (CdTe) but may also include other materials (also referred to as a cadmium telluride layer). For example, the absorber layer 20 can generally be formed from cadmium telluride and can have a bandgap tailored to absorb radiation energy (e.g., from about 1.4 eV to about 1.5 eV, such as about 1.45 eV) to create the maximum number of electron-hole pairs with the highest electrical potential (voltage) upon absorption of the radiation energy. Electrons may travel from the absorber layer 20 (e.g., a cadmium telluride layer) across the junction to the n-type window layer 18 (e.g., a cadmium sulfide layer 18) and, conversely, holes may pass from the n-type window layer 18 to the absorber layer 20. Thus, the p-n junction formed between the n-type window layer 18 and the absorber layer 20 forms a diode in which the charge imbalance leads to the creation of an electric field spanning the p-n junction. Conventional current is allowed to flow in only one direction and separates the light induced electron-hole pairs.

The absorber layer 20 can be formed by any known process, such as vapor transport deposition, chemical vapor deposition (CVD), spray pyrolysis, electro-deposition, sputtering, close-space sublimation (CSS), etc. In one particular embodiment, the n-type window layer 18 is deposited by a sputtering and the absorber layer 20 is deposited by close-space sublimation. In particular embodiments, the absorber layer 20 can have a thickness between about 0.1 μm and about 10 μm, such as from about 1 μm and about 5 μm. In one particular embodiment, the absorber layer 20 can have a thickness between about 2 μm and about 4 μm, such as about 3 μm.

A series of post-forming treatments can be applied to the exposed surface of the absorber layer 20. For example, when the absorber layer 20 includes cadmium telluride, these treatments can tailor the functionality of the cadmium telluride layer 20 and prepare its surface for subsequent adhesion to the back contact layer 22. For example, the cadmium telluride layer 20 can be annealed at elevated temperatures (e.g., from about 350° C. to about 500° C., such as from about 375° C. to about 424° C.) for a sufficient time (e.g., from about 1 to about 10 minutes) to create a quality p-type layer of cadmium telluride. Without wishing to be bound by theory, it is believed that annealing the cadmium telluride layer 20 (and the device 10) converts the normally n-type cadmium telluride layer 20 to a p-type cadmium telluride layer 20 having a relatively low resistivity. Additionally, the cadmium telluride layer 20 can recrystallize and undergo grain growth during annealing.

Annealing the cadmium telluride layer 20 can be carried out in the presence of cadmium chloride in order to dope the cadmium telluride layer 20 with chloride ions. For example, the cadmium telluride layer 20 can be washed with an aqueous solution containing cadmium chloride then annealed at the elevated temperature.

In one particular embodiment, after annealing the cadmium telluride layer 20 in the presence of cadmium chloride, the surface can be washed to remove any cadmium oxide formed on the surface. This surface preparation can leave a Te-rich surface on the cadmium telluride layer 20 by removing oxides from the surface, such as $CdO$, $CdTeO_3$, $CdTe_2O_5$, etc. For instance, the surface can be washed with a suitable solvent (e.g., ethylenediamine also known as 1,2 diaminoethane or "DAE") to remove any cadmium oxide from the surface.

Additionally, copper can be added to the cadmium telluride layer 20. Along with a suitable etch, the addition of copper to the cadmium telluride layer 20 can form a surface of copper-telluride on the cadmium telluride layer 20 in order to obtain a low-resistance electrical contact between the cadmium telluride layer 20 (i.e., the p-type layer) and the back contact layer(s). Specifically, the addition of copper can create a surface layer of cuprous telluride ($Cu_2Te$) between the cadmium telluride layer 20 and the back contact layer 22. Thus, the Te-rich surface of the cadmium telluride layer 20 can enhance the collection of current created by the device through lower resistivity between the cadmium telluride layer 20 and the back contact layer 22.

Copper can be applied to the exposed surface of the cadmium telluride layer 20 by any process. For example, copper can be sprayed or washed on the surface of the cadmium telluride layer 20 in a solution with a suitable solvent (e.g., methanol, water, or the like, or combinations thereof) followed by annealing. In particular embodiments, the copper may be supplied in the solution in the form of copper chloride, copper iodide, or copper acetate. The annealing temperature is sufficient to allow diffusion of the copper ions into the cadmium telluride layer 20, such as from about 125° C. to about 300° C. (e.g. from about 150° C. to about 200° C.) for about 5 minutes to about 30 minutes, such as from about 10 to about 25 minutes.

The back contact 22 can be, in one particular embodiment, formed from an optional graphite layer and a metal contact layer on the absorber layer 20 and generally serves as the back electrical contact, in relation to the opposite, TCO layer 14 serving as the front electrical contact. The back contact is formed on, and in one embodiment is in direct contact with, the cadmium telluride layer 20.

The graphite layer can include a polymer blend or a carbon paste and can be applied to the semiconductor device by any suitable method for spreading the blend or paste, such as screen printing, spraying or by a "doctor" blade. After the application of the graphite blend or carbon paste, the device 10 can be heated to convert the blend or paste into the conductive graphite layer. The graphite layer can be, in particular embodiments, from about 0.1 µm to about 10 µm in thickness, for example from about 1 µm to about 5 µm.

The metal contact layer can be made from one or more highly conductive materials, such as elemental nickel, chromium, copper, tin, aluminum, gold, silver, technetium or alloys or mixtures thereof. The metal contact layer, if made of or comprising one or more metals, is suitably applied by a technique such as sputtering or metal evaporation. The back contact layer 22 can be from about 0.1 µm to about 1.5 µm in thickness.

Other layers may also be present in the thin film stack, although not specifically shown in the embodiments of FIGS. 1-8. For example, index matching layers may be present between the transparent conductive oxide layer 14 and the transparent substrate 12. Additionally, an oxygen getter layer may be present in the thin film stack, such as adjacent to the transparent conductive oxide layer 14 (e.g., between the transparent conductive oxide layer 14 and the optional resistive transparent buffer layer 16). Additional components (not shown) can be included in the exemplary device 10, such as bus bars, external wiring, laser etches, etc.

As stated, the thin film photovoltaic device 10 generally has three terminals. For example, FIG. 9 shows an exemplary thin film photovoltaic device 10 that includes a plurality of photovoltaic cells 11 separated by scribe lines 26. It is noted that while the scribe lines 26 is shown, the three scribe lines 21, 23, and 26 are actually present as discussed above. However, due to the presence of the back contact layer 22 covering the first isolation scribe 21 and filling the series connecting scribe 23, only the second isolation scribe lines 26 are visible and thus appear to be a single line in the device 10.

As stated, the device defines individual photovoltaic cells 11 separated by scribes 26 to collectively form the first plurality 32 and second plurality 42 of serially connected cells 11 of, respectively, the first submodule 30 and the second submodule 40. Specifically, the individual photovoltaic cells 11 are electrically connected together in series in each submodule 30, 40. Each plurality 32, 42 of serially connected photovoltaic cells 11 are between a terminal cell 36, 46 and the dead cells 34, 44, respectively. As show, the dead cells 34, 44 are adjacent to each other and are electrically connected to the joint buss bar 52, while the terminal cells 36, 46 are located on opposite edges of the device 10. It is noted that the dead cells 34, 44 may be combined together to form a single cell, in certain embodiments. However, it may be desired to reverse the terminals such that the terminal cells are located adjacent to each other and electrically connected to the joint bus bar with the dead cells located on opposite edges of the device.

Any suitable configuration can be used to collect the DC current produced by the submodules 30, 40. FIG. 9 shows one particularly suitable configuration. As shown in FIG. 9, a linking insulation layer 60 extends from the first terminal cell 36 to the second terminal cell 46 over the photovoltaic cells 11 and the joint bus bar 52. A conductive link 62 is positioned on the linking insulation layer 60 and is electrically connected to the first terminal 38 and the second terminal 48. Thus, the linking insulation layer 60 electrically isolates the conductive link 62 from the joint bus bar 52 and the underlying photovoltaic cells 11, while the first terminal 38 and the second terminal 48 are electrically connected together.

Additionally, in the embodiment of FIG. 9, a common insulation layer 64 extends from the first terminal cell 36 to the joint bus bar 52. A first conductive lead 66 is positioned on the common insulation layer 64 and is electrically connected to the first terminal 38, and a second conductive lead 68 is positioned on the common insulation layer 64 and is electrically connected to the joint bus bar 52. Thus, the common insulation layer 64 electrically isolates the conductive leads 66, 68 from the underlying photovoltaic cells 11. The first and second conductive leads 66, 68 respectively terminate at the first and second leads 67, 69 for collection of the DC current produced by the device 10 from both the first and second submodules 30, 40.

The insulating layers 60, 64 generally include any insulating material that can prevent electrical conductivity therethrough. In one embodiment, each of the insulating layers 60, 64 can be an insulating polymeric film coated on both of its surfaces with an adhesive coating. The adhesive coating can allow for adhesion of the insulating layer 60, 64 to the underlying layers of the device (e.g., the photovoltaic cells 11) and for the adhesion of the conductive strips 62, 66, 68 to its respective insulating layer 60, 64. For example, each of the insulating layers 60, 64 can include a polymeric film of polyethylene terephthalate (PET) having an adhesive coating on either surface. The adhesive coating can be, for example, an acrylic adhesive, such as an acrylic adhesive.

Each of the insulating layers 60, 64 can have a thickness in the z-direction suitable to prevent electrical conductivity from the underlying thin film layers, particularly the back contact 22, to any subsequently applied layers.

The first and second conductive leads 66, 68, in one embodiment, can be applied as a continuous strip over the common insulating layer 64, and then severed to produce the first lead 67 and a second lead 69, as shown in FIG. 9. The conductive strips 62, 66, 68 can be constructed from any suitable material. In one particular embodiment, each of the conductive strips 62, 66, 68 is a strip of metal foil (e.g., that includes a conductive metal).

A junction box (not shown) can also be included in the device and can be configured to electrically connect the photovoltaic device 10 by completing the DC circuit, such as by connected to the first and second leads 67, 69.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A thin film photovoltaic device, comprising:
   a first submodule defined by a first plurality of photovoltaic cells between a first dead cell and a first terminal cell;
   a second submodule defined by a second plurality of photovoltaic cells between a second dead cell and a second terminal cell, wherein the first dead cell is adjacent to the second dead cell, the first dead cell being separated from the second dead cell via a separation scribe; and,
   a joint bus bar electrically connected to the first dead cell and the second dead cell.

2. The device as in claim 1, wherein the separation scribe is filled with a nonconductive material.

3. The device as in claim 2, wherein the separation scribe extends through an absorber layer, a window layer, and a transparent conductive oxide layer.

4. The device as in claim 1, wherein the separation scribe is filled with a conductive material.

5. The device as in claim 4, wherein the separation scribe electrically connects a back contact to a transparent conductive layer.

6. The device as in claim 1, wherein the separation scribe extends through a back contact layer.

7. The device as in claim 6, wherein the separation scribe further extends through an absorber layer.

8. The device as in claim 7, wherein the separation scribe further extends through a transparent conductive oxide layer.

9. The device as in claim 1, further comprising:
   a first terminal electrically connected to the first terminal cell; and,
   a second terminal electrically connected to the second terminal cell.

10. The device as in claim 9, further comprising:
    a conductive link electrically connecting the first terminal to the second terminal, wherein the conductive link is electrically isolated from the first dead cell and the second dead cell.

11. The device as in claim 1, wherein photovoltaic cells of the first and second submodules are separated from their adjacent photovoltaic cells by a first isolation scribe, a series connecting scribe, and a second isolation scribe.

12. The device as in claim 1, wherein each photovoltaic cell of the first and second submodules comprises a transparent conductive oxide layer on a transparent substrate; a window layer on the transparent conductive oxide layer, and an absorber layer on the window layer; and wherein the absorber layer comprises cadmium telluride.

13. A method of forming a thin film photovoltaic device according to claim 9, the method comprising:
    attaching a first terminal to a first terminal cell to electrically connect the first terminal to the first terminal cell, wherein the first terminal cell is positioned on one end of a first submodule defined by a first plurality of photovoltaic cells between the first terminal cell and a first dead cell;
    attaching a joint bus bar to the first dead cell and to a second dead cell to electrically connect the first dead cell and the second dead cell, wherein the second dead cell is positioned on one end of a second submodule defined by a second plurality of photovoltaic cells between the second dead cell and a second terminal, wherein the first dead cell and the second dead cell are separated via a separation scribe; and,
    attaching a second terminal to the second terminal cell to electrically connect the second terminal to the second terminal cell.

14. The method as in claim 13, further comprising:
    forming the separation scribe to remove an absorber layer, an n-type window layer, and a transparent conductive oxide layer.

15. The method as in claim 14, further comprising:
    filling the separation scribe with a nonconductive material.

16. The method as in claim 13, further comprising:
    forming the separation scribe to remove an absorber layer while leaving a transparent conductive oxide layer.

17. The method as in claim 16, filling the separation scribe with a conductive material.

18. The method as in claim 13, further comprising:
    forming the separation scribe to remove a back contact layer and an absorber layer; and, leaving the separation scribe unfilled in the device.

19. The method as in claim 18, wherein the separation scribe is formed via removing back contact layer, the absorber layer, a window layer, and a transparent conductive oxide layer.

20. The method as in claim 13, wherein the separation scribe is formed via a laser.

* * * * *